United States Patent [19]

Balcom

[11] 4,117,345

[45] Sep. 26, 1978

[54] MARINE GROUND ISOLATOR

[76] Inventor: Orville Balcom, 24521 Walnut St., Lomita, Calif. 90717

[21] Appl. No.: 826,851

[22] Filed: Aug. 22, 1977

[51] Int. Cl.$^2$ ............................................. H01B 7/28
[52] U.S. Cl. ...................................... 307/95; 204/196
[58] Field of Search .................. 307/95; 204/196, 147; 114/0.5 R

[56] References Cited

U.S. PATENT DOCUMENTS

| | | | |
|---|---|---|---|
| 3,258,612 | 6/1966 | Rubelmann | 307/95 |
| 3,636,409 | 1/1972 | Stephans | 204/196 |
| 3,769,926 | 11/1973 | Race | 307/95 |

*Primary Examiner*—Herman J. Hohauser
*Attorney, Agent, or Firm*—Lawrence V. Link, Jr.

[57] ABSTRACT

A marine ground isolator for selectively completing the current path through a ground connection. The herein illustrated embodiment includes a switch circuit connected in series between two portions of the ground connection and arranged so as to complete the current path therethrough only in response to an applied control signal; and means for monitoring the potential between the two portions of the ground connection and for applying the control signal to the switch circuit only when the absolute magnitude of the dc potential exceeds a first value or when the ac potential exceeds a second value.

10 Claims, 4 Drawing Figures

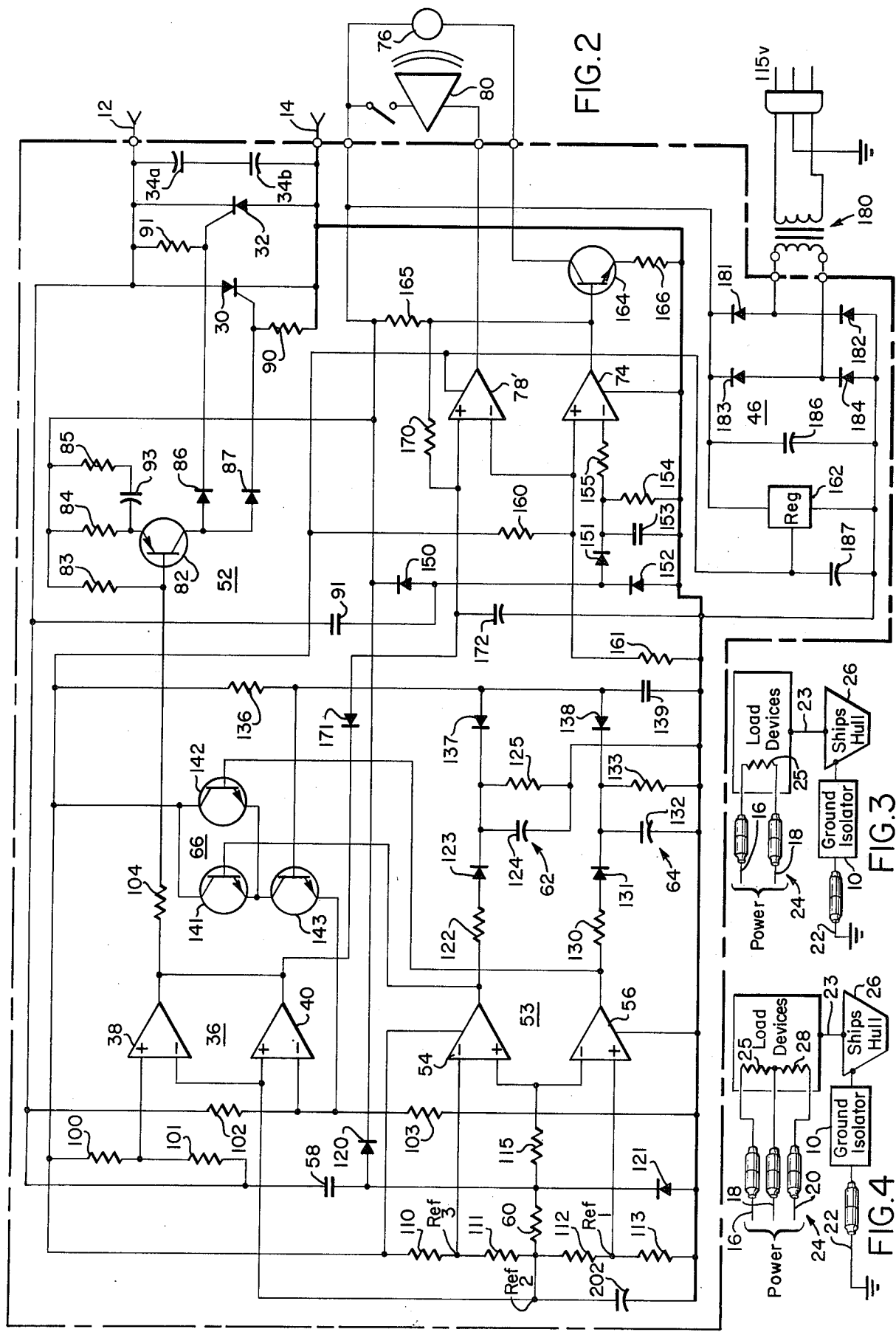

MARINE GROUND ISOLATOR

BACKGROUND OF THE INVENTION

This invention relates generally to ground isolation devices and particularly to marine ground isolators suitable for use in the ground connection between the ground conductor of a land power system and conductive portions of marine structures.

A boat setting in the water and having at least one conductive surface beneath the water line has the capability of supplying or taking current from the water. This capability is dependent upon the conductivity of the water and the amount of exposed conductor on the boat. Since nearly any boat will have at least a propeller and shaft in the water, there can generally be some conduction between the metal of the boat and the water. The boat will act as a cathode or an anode depending on the potential of the conductive surface relative to the water. In general, if the conductive surface is positive to the water, it can be considered an anode; and if current is allowed to flow, parts of the conductive metal will go into solution in the water and the metal will therefore corrode. The higher the potential and the more current that flows, the larger the amount of corrosion. The corrosion can be reduced by maintaining the potential of the conductive surface of the boat negative with respect to the water. Specifically, if the potential is maintained at 0.8 volts or more negative in respect to the water, all corrosion for most metals will be stopped. This is the well-known basis for cathodic protection against galvanic corrosion.

A problem exists whenever the exposed parts of the boat are connected through suitable current-carrying conductors to any other item which has a potential reference to the water. An example would be when the boat is electrically tied to the earth ground, a ground line for an electrical system, or a conductive dock. In this case, the boat may be driven positive or negative with respect to the water, depending on potential of the external object to which it is connected. For example, if the exposed conductive portions of a boat are connected to a shore ground line, which itself is 1 volt positive with respect to the water, the boat will then try to also be 1 volt positive with respect to the water and current will flow with the conductive surfaces acting as an anode, and therefore corroding.

There are two solutions to this problem: First, an equal and opposite potential could be introduced between the conductive surfaces of the boat and the ground power connection, but this potential source must be capable of supplying sufficient current to override the external source which was causing the original difference in voltage. Second, the connection from the boat to the shore ground connection can be broken. At the present time, the second solution is the one which is generally used by boats in marinas around the world.

Many boats also are connected to sources of 110 or 220 volt ac shore power while they are at the dock. Unless sophisticated and expensive isolation transformers are used, a safety problem can exist if the ground connection from the boat to the shore ground is removed. Any leakage from any electrical item on the boat from the shore power connection to the boat's conductive surface can raise these surfaces to a dangerous potential with respect to the surrounding water and dock. It is estimated that any voltage over 2½ volts rms could conceivably be dangerous when contacted by a person emersed in salt water. If no ground connection is used, it is also possible that conductive portions of the boat above the water line could become potentially dangerous with respect to a metal dock or the water itself. For the above reasons, it is desired to be able to maintain a shore ground connection to all exposed conductive portions of the boat whenever ac shore power is connected.

One present type of marine ground isolator uses silicon rectifiers arranged so that the intrinsic junction voltage drop of the diodes prevents current flow due to potentials below a preselected value; eg see U.S. Pat. No. 3,769,926. This diode junction voltage offset technique is also implemented in U.S. Pat. No. 3,636,409 which further incorporates capacitors shunting the diodes so as to provide an additional ground path for ac currents.

The above described isolators have proven quite satisfactory in many applications. However, a significant aspect of the subject invention is the implementation of a new and improved approach whereby ac and dc potentials across the "isolated" ground connection are separately monitored and used to control a switching arrangement in series with the ground connection.

SUMMARY OF THE INVENTION

A general object of the subject invention is to provide a new and improved marine ground isolator which provides galvanic protection against a relatively high level of dc potential while limiting the ac voltage across the ground connection to lower levels which are safe to personnel.

A more specific object of the invention is to provide isolation between the exposed conductive portions of a vessel and shore ground for dc voltages below a first preselected level, but to limit ac voltage, such as caused by malfunction or leakage to a second lower level.

Another object is to provide a ground isolator which directly measures the ac and dc potential across a ground connection and in response to the measured value clamps the ac and dc potentials to respective preselected values.

Still another object is to provide an improved marine ground isolator which provides indications and alarms as to the functioning of the unit.

An embodiment of the subject invention relates to marine ground isolators which are adapted for coupling in series in the connection between the ground conductor of a shore power source and the conductive portions of a vessel. It includes a switch arrangement connected in series between two portions of the ground connection for completing the current path therethrough only in response to an applied control signal.

A dc voltage monitor circuit provides a control signal when the absolute magnitude of the dc potential across the portions of the ground connection exceeds a first preselected value. An ac voltage monitor circuit causes a control signal to be supplied when the ac potential across the portion of the connection exceeds a second preselected value. An alarm monitor circuit produces an alarm indication when the ac or dc voltages across the ground connection exceed respective preselected values.

The dc voltage monitor has a first comparator for sensing dc potentials which are more positive than a preselected value and a second comparator for sensing dc potentials which are more negative than a preselected value. Circuits are provided for generating a control signal when either of these conditions are sensed.

The ac voltage monitor has first and second comparators coupled to first and second hold circuits, respectively. The hold circuits retain an output signal for a selected period after the removal of an input signal thereto and they, in conjunction with the comparators operate to detect only the positive and negative peaks of the ac potentials above a preselected level. Circuits are provided for combining the output signals from the hold circuits so as to produce a control signal when ac potentials above the preselected level are sensed, ie when both hold circuits have "high" output signals.

Hence, the subject invention provides isolation against relatively high dc voltages and thereby prevents corrosion of the hull of vessels due to electrolysis; while also limiting ac potential between the hull and shore ground to a safe lower potential value.

It is noted that ground isolators in accordance with the subject invention will not conduct for low level voltages unless they are actually alternating; ie, the potential must exceed both negative and positive thresholds of the ac comparators before conduction on the ground connection will be allowed for low voltages. For example, a direct voltage offset of 3, 4 or even 16 volts would be allowable across the ground connection but alternating voltages will be detected and clamped to 2.5 volts rms maximum.

BRIEF DESCRIPTION OF THE DRAWINGS

The novel features of this invention, as well as the invention itself, will be better understood from the accompanying description taken in conjunction with the accompanying drawings in which like reference characters refer to like parts and in which:

FIG. 2 is a schematic diagram of the isolator shown in FIG. 1; and

FIGS. 3 and 4 are schematic and block diagrams useful for illustrating how the marine ground isolator of FIG. 1 is connected between shore power systems and the hull of a marine vessel.

DESCRIPTION OF THE PREFERRED EMBODIMENTS

Figure 1:
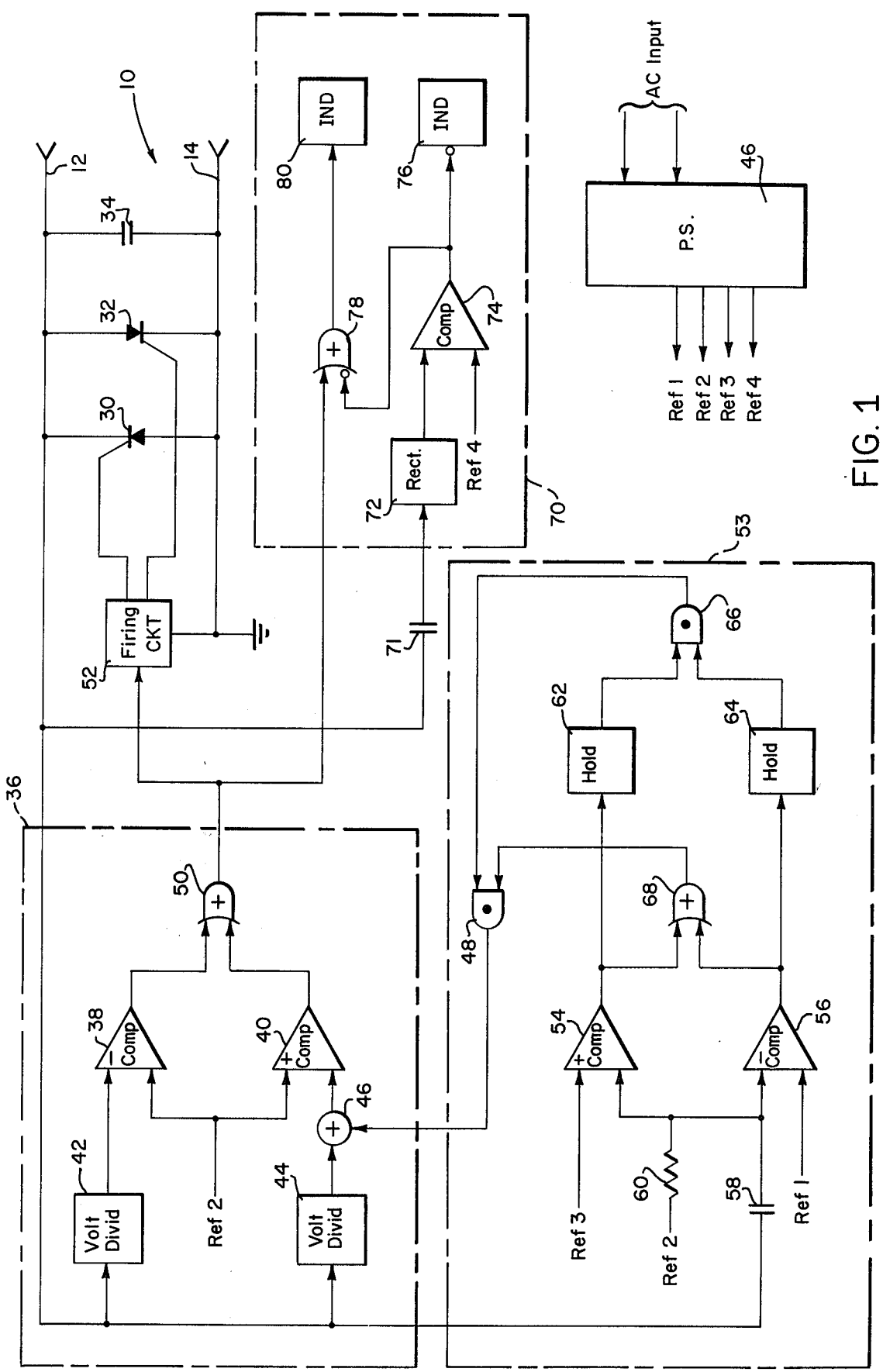
FIG. 1 is a block diagram of one preferred embodiment of a marine ground isolator in accordance with the subject invention.

A block diagram of one preferred embodiment of a marine ground isolator in accordance with the subject invention is shown in FIG. 1 and is designated generally by reference number 10. Ground leads 12 and 14 thereof are adapted, for example, to be connected in series in the connection between the ground conductor of a shore power system and the conductive portions of a vessel. Either of leads 12 or 14 may be connected to the shore ground conductor with the other lead being connected to the vessel's grounding system, eg its hull.

An arrangement showing a typical single phase installation of marine ground isolator 10 is illustrated in FIG. 3. In such an installation there is, for example, 110 volts ac across leads 16 and 18 from a shore power source (not shown). Leads 16 and 18 continue through connectors, indicated generally by reference numeral 24, to electrical load devices which are shown symbolically by a resistor 25. Lead 23 indicates the electrical path between the ship's hull 26 and segments of the load devices which normally do not have voltages applied thereto, such as for example, their cases and housings.

The ground isolator device 10 of the subject invention is connected in series between a ground lead 22 from the shore power source and the ship's hull 26.

An arrangement illustrating a typical two phase installation of marine ground isolator 10 is shown in FIG. 4 wherein, for example, there is 110 volts ac across leads 16 and 18 and across leads 18 and 20. Leads 16, 18 and 20 apply power from a shore power source (not shown) to electrical load devices which are indicated symbolically by resistors 25 and 28. The ground isolator 10 of the subject invention is connected in series between safety ground lead 22 from the shore power source and the ship's hull 26.

Again referring primarily to FIG. 1, silicon controlled rectifiers (SCRs) 30 and 32 are connected in a "back to back" arrangement between ground leads 12 and 14. It is noted that SCRs 30 and 32 may be replaced by a single triac thyristor (not shown) which has the characteristics of two back-to-back SCRs. A capacitor 34 is coupled in parallel with SCRs 30 and 32. This capacitor is not for providing a conductive path for large ac currents, but it merely provides a path for ac leakage currents in the milliamp range and for radio frequency (RF) currents from radio transmitting equipment contained on the vessel.

Two voltage sensing circuits, one for dc voltage monitoring, and the other for ac voltage monitoring are used in the embodiment of FIG. 1.

The dc voltage monitoring circuit 36 includes comparators 38 and 40 which are coupled to voltage divider circuits 42 and 44, respectively. Comparators 38 and 40 receive a "Ref. 2" signal from power supply unit 46. Voltage dividers 42 and 44 apply a preselected percentage of the voltage between input leads 12 and 14 to comparators 38 and 40, respectively. In the illustrated arrangement the signal on lead 12 is an input signal and lead 14 is used as the system reference. However, as noted previously, it is immaterial whether lead 12 or lead 14 is connected to the vessel or to the ground conductor of the shore power system.

The output signals from voltage dividers 42 and 44 are compared within comparators 38 and 40 against the "Ref. 2" signal and whenever the voltage supplied from the voltage divider 42 is equal to a preselected negative value, eg 16 volts or greater, the output of comparator 38 is true. Similarly whenever the voltage applied from voltage divider 44 to comparator 40 is sufficiently positive, eg 16 volts or greater, the output of comparator 40 is true.

A sum circuit 46 at the input to comparator 40 allows an input from an AND gate 48 to also drive comparator 40. It is noted that this implementation is used to eliminate the need for an additional driver amplifier between an AND gate 48 and an OR gate 50. Alternately, the output from AND gate 48 could be applied through an amplifier (not shown) directly to the input of firing circuit 52.

The output signals from comparators 38 and 40 are applied to the input circuit of OR gate 50 and the output signal from OR gate 50, which is sometimes hereinafter referred to as a control signal, is applied as an input signal to firing circuit 52. In response to an applied control signal, the firing circuit will bias SCRs 30 and 32 so that one of them will conduct. To summarize, if the voltage applied to voltage divider 42 is sufficiently negative, or if the voltage applied to voltage divider 44 is sufficiently positive, a signal from one of the comparators will flow through OR gate 50 to the firing circuit.

In response to the signal the firing circuit 52 will cause conduction of one of the SCRs, depending on the polarity of the voltage between leads 12 and 14.

The ac voltage monitor 53 includes comparators 54 and 56 and the input signal thereto is dc isolated by means of capacitor 58. The time constant of capacitor 58 and resistor 60 is sufficiently large so as not to substantially attenuate signals at the line frequency of the shore power source, eg 60 Hz. A positive reference, "Ref. 3", is applied to comparator 54 and "Ref. 1" is applied to comparator 56. "Ref. 3" is more positive than "Ref. 2" and "Ref. 2" is more positive than "Ref. 1". If the positive peak of the signal at the junction of capacitor 58 and resistor 60 is greater than the "Ref. 3", comparator 54's output will be true. If the minimum peak of the signal at said junction is less than "Ref. 1", comparator 56's output will be true. The output signals from comparators 54 and 56 are applied to hold circuits 62 and 64, respectively.

Hold circuits 62 and 64 hold the input signals applied thereto for at least two cycles of the line frequency, and preferably for 3 to 10 cycles. The output signals from hold circuits 62 and 64 are applied to AND gate 66, whose output will only be true when the output signals of both hold circuits are true. Hence both comparator 54 and comparator 56 must have true output signals within the "hold time", eg 2-10 cycles of the line frequency. The output signals of comparators 54 and 56 are also applied to OR gate 68 whose output will be true whenever either of the output signals from the comparators are true. The output signal from OR gate 68 is ANDed with the output of AND gate 66 in AND gate 48. The output signal from AND gate 48 is applied to sum circuit 46. The just described circuit arrangements overcome the delay inherent in the hold circuits and ensure timely triggering of SCRs 30 and 32 whenever the output of AND gate 66 is true.

To summarize the operation of ac monitor 53, whenever the input signal after dc isolation exceeds the maximum reference "Ref. 3", and then drops below the minimum reference "Ref. 1" within a period of 2-10 cycles of the line frequency, comparators 54 and 56 both will have had true outputs and so the output of both hold circuits will occur simultaneously and cause the output of AND gate 66 to be true. Also under the just described conditions one of the inputs to OR gate 68 will be true and hence the output from AND gate 48 will also be true. As indicated hereinabove, a true output from AND gate 48 to sum circuit 46 will cause firing circuit 52 to turn on one of the SCRs 30 or 32 and thereby clamp the potential of lead 12 to substantially the potential of lead 14. The peak-to-peak excursion of the allowable ac input signal before clamping, is set by the difference in potential between "Ref. 1" and "Ref. 3". The difference in potential would typically be selected as slightly less than the equivalent of 2.5 volts rms.

In the operation of the above described embodiment, whenever the voltage between leads 12 and 14 attempts to exceed the equivalent of 2.5 volts rms, in both the positive and negative directions, ac voltage monitor 53 activates SCR firing circuit 52. If the voltage exceeds the equivalent of 2.5 volts rms in only the positive or the negative direction, no clamping action occurs until the voltage exceeds that set in dc voltage monitor 36, eg 16 V dc. As noted previously, this is one of the significant aspects of the subject invention, ie ground isolator device 10 is insensitive to dc voltages up to a rather high set point, but will clamp within one or two cycles ac voltages at a much lower set point.

A very desirable feature of ground isolator unit 10 is implemented by an alarm monitor section 70. Lead 12 is ac coupled through capacitor 71 to the input of a rectifier 72, and the output signal therefrom is compared to a "Ref. 4" signal within a comparator 74. The level established by "Ref. 4" is above the acceptable clamp level and whenever the input signal to comparator 74 exceeds "Ref. 4" it signifies a failure in the primary protection part of the unit. Therefore indicator 76 is turned off when the output from comparator 74 is true. It is noted that in accordance with generally accepted logic circuit notation a small circle at a terminal, sometimes referred to as an inverting input terminal, indicates that a false signal enables that terminal. Hence indicator 76 is "on" only when the output from comparator 74 is false.

The output signal from comparator 74 is also applied to the inverting input terminal of an OR gate 78. The other input signal to gate 78 is the output signal from OR gate 50. As explained previously, this latter signal is true if the ac or dc thresholds potentials had been exceeded. The output signal from OR gate 78 is applied to a malfunction alarm unit 80 which is preferrably an audio alarm device. Hence unit 80 will provide an alarm indication if a malfunction of the primary protection part of the unit is detected by comparator 74 or if the isolation between vessel and shore grounds has been removed by the activation of SCRs 30 or 32.

Power supply 46 which is transformer isolated from the ac line, provides a nominal 8 volt dc supply for the circuitry of unit 10 and also provides regulated reference voltages, ie "Ref. 1 through Ref. 4".

Referring now primarily to the schematic diagram of FIGS. 2 and 3, capacitor 34 shown in the block diagram of FIG. 1 is implemented in the detailed schematic of FIG. 2 by two series coupled polarized capacitors 34a and 34b.

SCR firing circuit 52 (FIG. 1) includes a transistor 82 and resistors 83, 84 and 85. Diodes 86 and 87 couple the output from transistor 82 to the appropriate SCR. Resistors 90 and 91 ensure turnoff of the SCRs in the absence of firing current from transistor 82; and capacitor 93 in conjunction with resistor 85 provides a high "spike" of firing current to ensure complete turnon of the SCRs.

Resistors 100 and 101 of FIG. 2 provide the voltage division of divider 42 in FIG. 1; while resistors 102 and 103 of FIG. 2 implement divider 44 of FIG. 1. Comparators 38 and 40 (FIGS. 1 and 2) have open output collectors so that they may be "tied" together to form OR gate (wired OR) 50 of FIG. 1. Resistor 104 sets the current into firing circuit 52. The references applied to comparators 38 and 40 are provided from resistors 110–113 which are considered functionally as part of the power supply.

The input signal to ac voltage monitor 53 is dc isolated by capacitor 58 and resistor 115 provides current limiting in case of extremely large input signals. Diodes 120 and 121 are provided to limit large inputs so as to avoid damage to comparators 54 and 56. Hold circuit 62 comprises resistor 122, diode 123, capacitor 124 and resistor 125. Hold circuit 64 comprises resistor 130, diode 131, capacitor 132 and resistor 133. Resistor 136 and diodes 137 and 138 form AND gate 66 (FIG. 1) and capacitor 139 provides noise suppression. OR gate 68 (FIG. 1) comprises transistors 141 and 142 and AND gate 48 (FIG. 1) includes transistor 143. Sum circuit 46 of FIG. 1 is implemented by the addition, across resistor 103, of the signal from AND gate 48 to the negative input of comparator 40.

Rectifier 72 of FIG. 1 includes a clamp diode 150 and rectifier diodes 151 and 152. The rectified output is stored in a capacitor 153 which is paralleled by a bleeder resistor 154. The output from the rectifier is applied to comparator 74 through a resistor 155. An independent reference voltage is generated by resistors 160 and 161 which are coupled to +8 V dc regulated power supply 162. Comparator 74 compares this rectified signal to that produced by resistors 160 and 161 and its output goes low whenever the input from the rectifier exceeds the reference. This action turns off transistor 164, which is normally biased on by resistor 165. When transistor 164 turns off, dial light 76 (indicator 2) is extinguished. Resistor 166 provides current limiting and sufficient voltage drop at the emitter of transistor 164 to provide a properly scaled signal to comparator 78'.

Element 78' is an integrated circuit comparator. However it is used as an OR gate with an inverting input. One input signal is supplied through resistor 170 and the other through diode 171. If the voltage from diode 171 or resistor 170 is low, the output from comparator 78' also will be at low. Capacitor 172 provides noise filtering so that momentary transients will not indicate a malfunction.

As shown in FIG. 2, power supply 46 (FIG. 1) includes a transformer 180, bridge rectifiers 181-184 and a capacitor 186. The output from capacitor 186 is regulated in integrated circuit 162 and provides a regulated 8 volt output. Capacitor 187 reduces the output impedance of the regulator.

So as to ensure the fullest possible disclosure the below listed values for the elements in FIG. 2 are provided. It will however be understood that these values are by way of illustration and not in any way limiting of the scope of the subject invention.

TABLE OF VALUES FOR ELEMENTS OF FIGURE 2

| Element reference number | Value or type |
| --- | --- |
| 34a | 2200 microfarads |
| 34b | 2200 microfarads |
| 30 | 1S020 |
| 32 | 1S020 |
| 90 | 1 K ohms |
| 91 | 1 K ohms |
| 83 | 1 K ohms |
| 84 | 82 ohms |
| 85 | 10 ohms |
| 93 | 10 microfarads |
| 82 | 2N6124 |
| 86 | IN4003 |
| 87 | IN4003 |
| 136 | 220 K ohms |
| 141-143 | 2N2219 |
| 104 | 1 K ohms |
| 38 | LM339 |
| 40 | LM339 |
| 102 | 22 K ohms |
| 100 | 10 K ohms |
| 101 | 47 K ohms |
| 58 | .22 microfarads |
| 103 | 10 K ohms |
| 110 | 52.7 K ohms |
| 111 | 1 K ohms |
| 112 | 1 K ohms |
| 113 | 2.7 K ohms |
| 202 | 10 microfarads |
| 60 | 100 K ohms |
| 121 | IN4003 |
| 115 | 100 K ohms |
| 54 | RC 4558 |
| 56 | RC 4558 |
| 122 | 470 ohms |
| 130 | 470 ohms |
| 124 | 10 microfarads |
| 132 | 10 microfarads |
| 125 | 22 K ohms |
| 133 | 22 K ohms |
| 139 | .0033 microfarads |
| 152 | IN4003 |
| 153 | .22 microfarads |
| 154 | 220 K ohms |
| 155 | 10 K |
| 160 | 6.8 K |
| 161 | 2.7 K |
| 164 | 2N2219 |
| 165 | 10 K ohms |
| 166 | 39 ohms |
| 170 | 100 ohms |
| 150 | IN4003 |
| 91 | .068 microfarads |
| 172 | 2 microfarads |
| 74 | LM339 |
| 78' | LM339 |
| 181-184 | IN4003 |
| 186 | 1000 microfarads |
| 162 | UA7808 |
| 187 | 100 microfarads |

Diodes not specified above are IN4148.

It is noted that although the subject invention has been herein described primarily in regard to a ship-shore application, it is equally applicable to the protection of off-shore structures from galvanic corrosion; or in general for applications in which a ground connection is desired only for dc and ac potentials which exceed preselected respective values.

Thus, having described a new and improved ground isolator device, what is claimed is:

1. A ground device adapted for use in a ground connection so as to selectively allow the flow of current therethrough, said device comprising:
   switch means connected in series between two portions of said ground connection for providing a low impedance connection therebetween only in response to an applied control signal; and
   means for monitoring the potential between said portions of the ground connection and for applying a control signal to said switch means only when the dc potential between said portions of the ground connection is outside of a preselected voltage range or when the ac potential therebetween exceeds a preselected value.

2. The ground isolator device of claim 1 further comprising means for providing an alarm indication in response to said control signal.

3. The ground isolator device of claim 1 further comprising means for providing an alarm indication when the ac potential between said portions of the ground connection exceeds a preselected value.

4. The ground isolator device of claim 1 wherein said monitoring means includes a dc voltage monitor having a first comparator for sensing dc potentials which are more positive than a preselected threshold value and a second comparator for sensing dc potentials which are more negative than a preselected threshold value and means for producing control signals when potentials in excess of either of said thresholds are sensed.

5. The ground isolator device of claim 1 wherein said monitoring means includes an ac voltage monitor having first and second hold circuits which in response to an applied input signal provide an output signal for a selected time after the termination of the input signal;

first and second comparator circuits for sensing positive and negative potentials, respectively, which exceed given threshold values, and for applying input signals to said first and second hold circuits, respectively, in response to sensing potentials which exceed said thresholds; and means for applying a control signal to said switch means when there are simultaneous outputs from said first and second hold circuits.

6. The ground isolator device of claim 1 wherein said switch means comprises two silicon controlled rectifiers each of which have their anode and cathode current paths connected across the two portions of the ground connection such that the anode of one silicon controlled rectifier is connected to the cathode of the other silicon controlled rectifier, and their gates are coupled to receive the control signal.

7. A marine ground isolator adapted for coupling in series in the connection between the ground line of a shore power source and the conductive surfaces of a vessel, said isolator comprising:
  switch means, connected in series between two portions of said connection, for completing the current path therethrough only in response to an applied control signal;
  first means for providing the control signal when the absolute magnitude of the dc potential between said portions of the connection exceeds a first preselected value; and
  second means for providing said control signal when the ac potential between said portions of the connection exceeds a second preselected value.

8. The marine ground isolator of claim 7 further comprising means for providing an alarm indication in response to said control signal or when the ac potential between said portions of said connection exceeds a third preselected value.

9. The marine ground isolator of claim 7 wherein said switch means comprises two silicon controlled rectifiers each of which have their anode and cathode current paths connected across the two portions of said connection such that the anode of one silicon controlled rectifier is connected to the cathode of the other silicon controlled rectifier and their gates are coupled to receive the control signal.

10. The marine ground isolator of claim 7 wherein said first means includes a dc voltage monitor having a first comparator for sensing dc potentials which are more positive than a preselected threshold value and a second comparator for sensing dc potentials which are more negative than a preselected threshold value and means for producing control signal when potentials in excess of either of said thresholds are sensed; and wherein said second means includes an ac voltage monitor having first and second hold circuits which in response to an applied input signal provide an output signal for a selected time after the termination of the input signal; first and second comparator circuits for sensing positive and negative potentials, respectively, which exceed given threshold values, and for applying input signals to said first and second hold circuits, respectively, in response to sensing potentials which exceed said thresholds; and means for applying a control signal to said switch means when there are simultaneous outputs from said first and second hold circuits.

* * * * *